United States Patent [19]

Belouet

[11] Patent Number: 4,478,880

[45] Date of Patent: Oct. 23, 1984

[54] METHOD OF FABRICATING POLYCRYSTALLINE SILICON STRIPS

[75] Inventor: Christian Belouet, Sceaux, France

[73] Assignee: Compagnie Generale D'Electricite, Paris, France

[21] Appl. No.: 507,651

[22] Filed: Jun. 27, 1983

[30] Foreign Application Priority Data

Jun. 25, 1982 [FR] France .................................. 82 11171

[51] Int. Cl.³ .......................... B05D 5/12; H01L 31/18
[52] U.S. Cl. ........................................ 427/86; 427/74;
427/227; 136/258; 156/622; 156/624;
156/DIG. 84; 156/DIG. 88
[58] Field of Search ........................... 427/74, 86, 227;
136/258 PC; 156/DIG. 88, DIG. 64, DIG. 84,
622, 624

[56] References Cited

U.S. PATENT DOCUMENTS

| | | | |
|---|---|---|---|
| 4,131,659 | 12/1978 | Authier et al. | 264/25 |
| 4,233,338 | 11/1980 | Ricard et al. | 427/85 |
| 4,238,436 | 12/1980 | Hill et al. | 264/81 |
| 4,250,148 | 2/1981 | Cota et al. | 422/246 |
| 4,252,861 | 2/1981 | Heaps et al. | 428/446 |
| 4,305,776 | 12/1981 | Grabmaier | 156/605 |
| 4,323,419 | 4/1982 | Wakefield | 156/622 |
| 4,357,200 | 11/1982 | Grabmaier | 156/603 |
| 4,357,201 | 11/1982 | Grabmaier et al. | 156/603 |
| 4,370,288 | 1/1983 | Rice, Jr. et al. | 264/81 |

FOREIGN PATENT DOCUMENTS

| | | | |
|---|---|---|---|
| 2204457 | 5/1974 | France | 427/74 |
| 2386359 | 12/1978 | France | 136/258 |
| 1396683 | 6/1975 | United Kingdom | 427/74 |

OTHER PUBLICATIONS

T. F. Ciszek, "Silicon Sheet Technologies", *Conf. Record*, *16th IEEE* Photovoltaic Specialists Conf. (1982), pp. 316-326, (Publ. 1983).

*Primary Examiner*—Aaron Weisstuch
*Attorney, Agent, or Firm*—Sughrue, Mion, Zinn, Macpeak and Seas

[57] ABSTRACT

A fabrication method for use in making photocells consisting in depositing on the top face of a carbon ribbon (4) being moved horizontally in its lengthwise direction through an oven (9) a layer of silicon, said oven being imparted a vertical temperature gradient, and in burning away the portion of the ribbon supporting the silicon layer immediately following deposition of said layer.

6 Claims, 2 Drawing Figures

METHOD OF FABRICATING POLYCRYSTALLINE SILICON STRIPS

This invention relates to a method of fabricating a strip of polycrystalline silicon.

Small plates of polycrystalline silicon for use in making photocells are known to be obtained in the prior art by sawing slices from silicon ingots. This technique is time-consuming and costly and requires a much thicker layer of silicon than is actually necessary for photovoltaic conversion.

Another method of fabrication, described in French Pat. No. 2,386,359, consists in running a carbon ribbon vertically through a molten silicon bath. This method yields an easily-cut tape comprising a carbon substrate both sides of which are coated with polycrystalline silicon. From this tape or strip, small plates can be made, having a stable carbon substrate, for use in making solar cells.

Unfortunately, the photo-electric efficiency of such plates can be limited by the characteristics of the electrical contact between the silicon layer and the carbon backing. Moreover, due to the presence of said carbon substrate, the fabrication of such photocells is very complex.

The object of the present invention is to provide a thin strip consisting of polycrystalline silicon alone, without a substrate.

This invention is directed to an improved method of fabricating a polycrystalline silicon strip for photocells, comprising a first step of running a carbon substrate in a substantially horizontal direction, said substrate being preheated to a temperature substantially the same as the melting point for silicon, and a second step of depositing the silicon on the top face of the substrate such as to form a uniform layer of molten silicon on said substrate, said silicon layer being deposited whilst a vertical temperature gradient is maintained to cause a gradual cooling of the silicon layer from top to bottom, said fabrication method being characterized in that the preheating of said carbon ribbon substrate being caused to move in its lengthwise direction is carried out in a first oven (7) and said silicon deposition is performed in a second oven (9), the said carbon ribbon (4) being conveyed through both said ovens one after the other in a neutral atmosphere and said fabrication process being further characterized by a third step, immediately following the deposition step, when the ribbon leaves the second oven (9), of burning away the carbon substrate supporting the layer of deposited silicon so that only the polycrystalline silicon strip means.

Alternative modes of implementing the fabrication method according to the invention are described below by way of example, with reference to the appended drawings.

DESCRIPTION OF THE PREFERRED EMBODIMENTS

Figure 1:
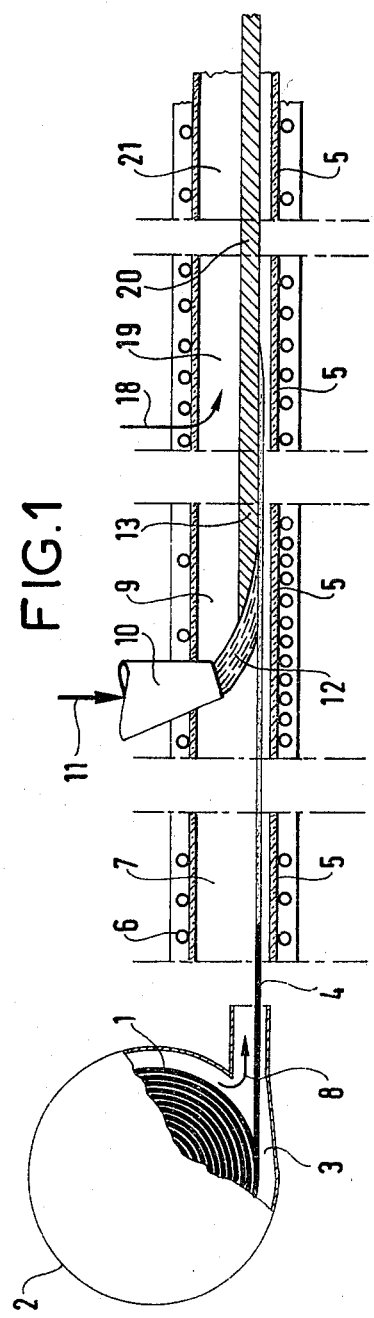
FIG. 1 is a schematic representation of a silicon strip production line.

As shown in FIG. 1, a reel 1 of carbon ribbon is placed in coaxial relation inside a horizontally mounted cylindrical cassette 2. Said ribbon essentially consists of graphite superficially coated with lamellar pyrocarbon in nonreactive relation with the molten silicon. The end of the carbon ribbon 4 emerges from an opening 3 in the side of the cassette 2. Said end is moved horizontally in its lengthwise direction in a continuous manner, by means of a conveyor belt (not shown), so as to unreel reel 1. Ribbon 4 then passes through a quartz tube 5 of rectangular section wherein a plurality of succeeding work stations have been arranged. Ribbon 4 thus passes through a first station wherein an electrical winding 6 has been arranged around the tube 5 to constitute a preheating oven 7. A neutral gas such as argon is injected into oven 7 from cassette 2 along direction 8 and made to circulate therein. In said first station or oven 7, ribbon 4 is heated to a temperature substantially equal to that of the melting point of silicon.

Ribbon 4 thereafter passes through a second station consisting of an oven 9, the electrical resistances whereof are wound around the tube, such that the turns of said resistances are unequally distributed between the top and the bottom of the oven, thereby providing a vertical temperature gradient, with the temperture decreasing from the bottom to the top of the oven 9. Clearly, the neutral gas having circulated through oven 7 also flows through oven 9. Alternatively, it would be possible to obtain the desired temperature gradient by distributing the resistance turns equally between the top and the bottom of oven 9 and injecting cooled argon into the top of oven 9.

The roof of oven 9 is provided with a funnel 19 through which molten silicon is poured following the direction of arrow 11. The silicon 12 leaving the funnel 19 is deposited on the top face of ribbon 4 and gradually cools so as to form a layer of crystallized silicon 13 of uniform thickness as the ribbon passes through oven 9.

Figure 2:
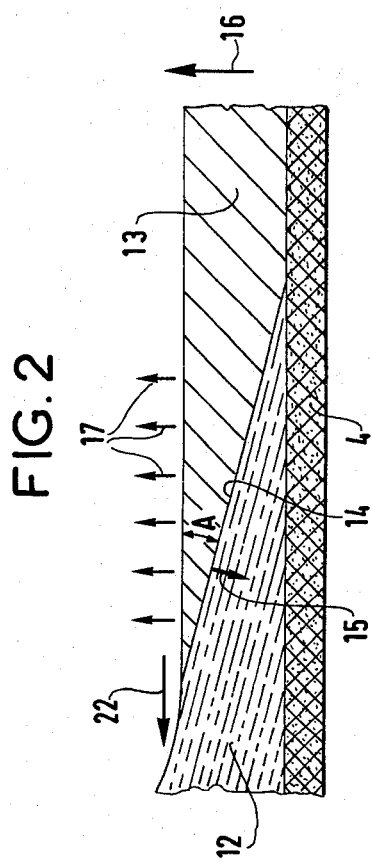
FIG. 2 is a schematic drawing showing how gradual crystallization of the deposited silicon is obtained during one of the fabrication steps.

The gradual crystallization of layer 13 will be better understood with reference to FIG. 2. The temperature gradient in the oven is such that the junction plane 14 between the crystallized silicon 13 and the liquid silicon 12 is inclined to an angle "A" in relation to the plane of the ribbon 4, in the direction shown in the figure. Plane 14 advances in the direction of arrow 15 at a speed "v", said speed being related to the speed at which the ribbon is pulled, "u", by the following equation:

$$v = u \sin A$$

The silicon growth or crystallization speed 22 at the level of the top surface of layer 13 is equal, in the reverse direction, to the pulling speed u. Angle A is relatively small, such that pulling speed u can be very fast as compared with growing speed v. This implies a temperature gradient in the direction of arrow 16, with heat loss through the open face of the silicon layer following arrows 17. It should be noted that said temperature gradient is far less than that which would be required for vertical pulling at the same given pulling speed "u". The thermal stresses affecting the layer in horizontal travel are thus less than in the case of vertical pulling.

Another embodiment of the invention may be envisaged whereby, instead of pouring liquid silicon through a funnel like that designated by the number 10 in FIG. 1, powdered silicon would be deposited on the top face of ribbon 4 by other means not depicted here. In this case, the silicon powder would be melted as soon as it touched said top face of the ribbon. Crystal growth would thereafter proceed as decribed above.

Better control of the crystalization process may also be obtained by slightly inclining the oven 9 in relation to the horizontal.

Upon leaving oven 9, the carbon ribbon, with its coat of silicon 13, passes through a third station also comprising wound heater elements and further comprising an oxygen inlet penetrating through the wall of tube 5 as per arrow 18. This station consists in a combustion chamber 19 wherein the carbon ribbon backing supporting the layer of deposited silicon is burned away.

Upon leaving oven 19, only a silicon strip 20 remains, therefore. Said strip is picked up by another conveyer (not shown) and taken through a fourth station consisting of an oven 21 wherein the silicon strip is subjected to controlled gradual cooling.

If the strip thus obtained is to be used in making photocells, the device depicted in FIG. 1 can be further provided, after oven 21, with cutting station to cut plates or wafers from the silicon strip and with a station for deoxidizing said wafers prior to their transfer to the photocell production line. The cutting can be done with a laser and the deoxidizing by means of plasma processing.

The fabrication process described hereinabove provides numerous advantages.

It enables only the exact quantity of silicon required for making very thin strips, less than 100 microns thick, to be used. It involves a continuous process which can be easily integrated into a production line operating at pulling speeds greater than 0.5 m/min. It makes it possible to draw several ribbons in parallel through a single, rectangular silicon tube, e.g. with three 10 cm-wide ribbons arranged in parallel, all drawn at a speed of 0.5 m/min., it is possible to obtain a production capacity per machine of 1500 $cm^2$/min.

Furthermore, only minor thermal and thermo-elastic stresses are imposed on the silicon strips. The burning stage occurs immediately following deposition, i.e. before the deposited silicon layer has time to cool, such that damage of said layer from any thermal stresses that might occur between the silicon layer and the carbon ribbon during cooling is avoided. In addition, the burning phase eliminates surface contamination. The resulting product is large-grained, making it compatible with a photoelectric conversion efficiency of better than 11%, for example.

A still further advantage resides in the method's simplicity and in the cost savings it provides per square meter of silicon strip.

The fabrication technique according to the invention can be applied to the production of photocells, or more generally, to the production of large plates or wafers of polycrystalline silicon, measuring, for example, 20 cm×°cm.

I claim:

1. A method of fabricating a polycrystalline silicon strip of photocells, comprising:
    a first step of moving a carbon ribbon substrate in a substantially horizontal direction and preheating said substrate to a temperature substantially the same as the melting point of silicon, and
    a second step of depositing silicon on the top face of the substrate so as to form a uniformly thick layer of molten silicon on said substrate while a vertical temperature gradient is maintained to cause a gradual cooling of the silicon layer from top to bottom, and wherein said step of preheating of said carbon ribbon substrate is effected by moving it lengthwise through a first oven (7) and said step of silicon deposition is performed in a second oven (9), and wherein said carbon ribbon is conveyed through both said ovens one after the other in a neutral atmosphere, and wherein said fabrication method further comprises
    a third step, immediately following the second, deposition step and the ribbon's leaving the second oven (9), of burning away the carbon substrate supporting the layer of deposited silicon so that only the polycrystalline silicon strip remains, and then subjecting said silicon strip to a deoxidizing step within a deoxidizing station by plasma processing.

2. A fabrication method as in claim 1, wherein the silicon is deposited in molten form on the top face of the ribbon.

3. A fabrication method as in claim 1, wherein the silicon is deposited in powdered form on the top face of the ribbon.

4. A fabrication method as in claim 1, wherein said carbon substrate supporting the deposited silicon is burned in an atmosphere of oxygen.

5. A fabrication method as in claim 1, further comprising the step of gradual cooling of the silicon strip following the burning step.

6. A fabrication method as in claim 1, wherein the second oven is slightly inclined from the horizontal.

* * * * *